United States Patent
Sameshima

(10) Patent No.: US 9,437,544 B2
(45) Date of Patent: Sep. 6, 2016

(54) SEMICONDUCTOR DEVICE

(71) Applicant: ROHM CO., LTD., Kyoto (JP)

(72) Inventor: Katsumi Sameshima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/690,982

(22) Filed: Apr. 20, 2015

(65) Prior Publication Data

US 2015/0228575 A1 Aug. 13, 2015

Related U.S. Application Data

(63) Continuation of application No. 12/272,001, filed on Nov. 17, 2008, now Pat. No. 9,035,455.

(30) Foreign Application Priority Data

Nov. 16, 2007 (JP) ................................ 2007-298361

(51) Int. Cl.
*H01L 23/48* (2006.01)
*H01L 23/528* (2006.01)
(Continued)

(52) U.S. Cl.
CPC ......... *H01L 23/528* (2013.01); *H01L 23/3171* (2013.01); *H01L 23/525* (2013.01); *H01L 24/03* (2013.01); *H01L 24/05* (2013.01); *H01L 24/11* (2013.01); *H01L 24/13* (2013.01); *H01L 24/32* (2013.01); *H01L 2224/0345* (2013.01); *H01L 2224/0361* (2013.01);
(Continued)

(58) Field of Classification Search
CPC . H01L 23/528; H01L 23/3171; H01L 24/13; H01L 224/1301; H01L 2224/32501; H01L 23/525; H01L 24/05; H01L 24/11; H01L 2924/0002; H01L 2224/0401; H01L 2924/01074; H01L 2224/05647; H01L 24/32; H01L 2224/1192; H01L 2224/13006; H01L 2224/1301; H01L 2224/13018; H01L 2224/131; H01L 2224/13144
USPC .................... 257/737, 738, E33.056, E33.06
See application file for complete search history.

(56) References Cited

U.S. PATENT DOCUMENTS

| 5,508,561 | A | * | 4/1996 | Tago | ........................ | H01L 24/11 257/737 |
| 5,731,219 | A | | 3/1998 | Ikeda et al. | | |

(Continued)

FOREIGN PATENT DOCUMENTS

| JP | 54-111761 | 9/1979 |
| JP | 01-278751 | 11/1989 |

(Continued)

*Primary Examiner* — Yosef Gebreyesus
(74) *Attorney, Agent, or Firm* — Rabin & Berdo, P.C.

(57) ABSTRACT

A semiconductor device includes a semiconductor chip, a wiring on the chip, an insulating film coating the wiring and having an opening partially exposing the wiring, a Ti/W film on a portion of the wiring facing the opening, a Cu layer on the Ti/W film and the wiring's exposed portion, and having a peripheral edge protruding away from the opening more than Ti/W film's peripheral edge in parallel to an insulating film surface, and a solder ball bonded to the Cu layer. The protrusion of the Cu layer's peripheral edge with respect to the Ti/W film's peripheral edge is greater than the Ti/W film's thickness. The Ti/W film's surface doesn't vertically surpass the Cu layer's upper surface in the opening's center. A Cu layer/solder ball interface is arc-shaped on both sides of the Cu layer's upper surface in a cross section taken perpendicularly to the Cu layer's upper surface.

17 Claims, 4 Drawing Sheets

(51) Int. Cl.
*H01L 23/525* (2006.01)
*H01L 23/00* (2006.01)
*H01L 23/31* (2006.01)

(52) U.S. Cl.
CPC .............. *H01L 2224/03912* (2013.01); *H01L 2224/03914* (2013.01); *H01L 2224/0401* (2013.01); *H01L 2224/05017* (2013.01); *H01L 2224/05018* (2013.01); *H01L 2224/05027* (2013.01); *H01L 2224/0556* (2013.01); *H01L 2224/05166* (2013.01); *H01L 2224/05541* (2013.01); *H01L 2224/05559* (2013.01); *H01L 2224/05564* (2013.01); *H01L 2224/05572* (2013.01); *H01L 2224/05647* (2013.01); *H01L 2224/1147* (2013.01); *H01L 2224/11912* (2013.01); *H01L 2224/131* (2013.01); *H01L 2224/1301* (2013.01); *H01L 2224/13006* (2013.01); *H01L 2224/13018* (2013.01); *H01L 2224/13022* (2013.01); *H01L 2224/13082* (2013.01); *H01L 2224/13144* (2013.01); *H01L 2224/32501* (2013.01); *H01L 2924/0002* (2013.01); *H01L 2924/014* (2013.01); *H01L 2924/01006* (2013.01); *H01L 2924/01013* (2013.01); *H01L 2924/01029* (2013.01); *H01L 2924/01033* (2013.01); *H01L 2924/01073* (2013.01); *H01L 2924/01074* (2013.01); *H01L 2924/01078* (2013.01); *H01L 2924/01079* (2013.01)

(56) References Cited

U.S. PATENT DOCUMENTS

| | | | |
|---|---|---|---|
| 6,111,317 A * | 8/2000 | Okada | H01L 24/10 257/700 |
| 6,133,136 A * | 10/2000 | Edelstein | H01L 24/05 257/750 |
| 6,293,457 B1 | 9/2001 | Srivastava et al. | |
| 6,323,542 B1 | 11/2001 | Hashimoto | |
| 6,335,568 B1 * | 1/2002 | Yuzawa | H01L 24/13 257/738 |
| 6,362,087 B1 | 3/2002 | Wang et al. | |
| 6,426,556 B1 | 7/2002 | Lin | |
| 6,436,300 B2 | 8/2002 | Woolsey et al. | |
| 6,479,900 B1 * | 11/2002 | Shinogi | H01L 23/3114 257/738 |
| 6,864,168 B2 | 3/2005 | Chen et al. | |
| 6,927,489 B1 | 8/2005 | Yaguchi et al. | |
| 7,064,436 B2 | 6/2006 | Ishiguri et al. | |
| 7,235,881 B2 * | 6/2007 | Hashimoto | H01L 23/3114 257/748 |
| 7,663,201 B2 * | 2/2010 | Yamada | H01L 24/16 257/459 |
| 7,947,978 B2 | 5/2011 | Lin et al. | |
| 7,985,671 B2 * | 7/2011 | Daubenspeck | H01L 24/11 257/737 |
| 7,989,356 B2 * | 8/2011 | Bao | H01L 24/03 257/778 |
| 8,643,150 B1 * | 2/2014 | Xu | H01L 24/11 257/632 |
| 8,669,137 B2 * | 3/2014 | Nah | H01L 21/563 257/E21.502 |
| 9,087,701 B2 * | 7/2015 | Park | H01L 24/97 |
| 2002/0072215 A1 | 6/2002 | Furuya | |
| 2004/0113272 A1 * | 6/2004 | Chen | H01L 24/03 257/737 |
| 2004/0222522 A1 | 11/2004 | Homma | |
| 2005/0092611 A1 | 5/2005 | Kim et al. | |
| 2005/0140004 A1 | 6/2005 | Ishiguri et al. | |
| 2005/0199995 A1 | 9/2005 | Nomoto et al. | |
| 2006/0030139 A1 | 2/2006 | Mis et al. | |
| 2006/0214296 A1 | 9/2006 | Okamoto et al. | |
| 2006/0246706 A1 | 11/2006 | Ke et al. | |
| 2006/0258045 A1 | 11/2006 | Ishiguri et al. | |
| 2006/0292711 A1 | 12/2006 | Su et al. | |
| 2007/0246133 A1 | 10/2007 | Helneder et al. | |
| 2007/0290343 A1 | 12/2007 | Harada et al. | |
| 2008/0036086 A1 | 2/2008 | Ishio | |

FOREIGN PATENT DOCUMENTS

| | | |
|---|---|---|
| JP | 09-139387 | 5/1997 |
| JP | 09-199505 | 7/1997 |
| JP | 2004-071872 A | 3/2004 |
| JP | 2004-152953 A | 5/2004 |
| JP | 2005-085857 A | 3/2005 |
| JP | 2005-166959 A | 6/2005 |
| JP | 2005-175128 A | 6/2005 |
| JP | 2005-353897 | 12/2005 |
| JP | 2006-278551 A | 10/2006 |

* cited by examiner

SEMICONDUCTOR DEVICE

CROSS-REFERENCE TO RELATED APPLICATION

This application is a continuation of application Ser. No. 12/272,001, filed on Nov. 17, 2008. Furthermore, this application claims the benefit of priority of Japanese application 2007-298361, filed on Nov. 16, 2007. The disclosures of these prior U.S. and Japanese applications are incorporated herein by reference.

BACKGROUND OF THE INVENTION

1. Field of the Invention

The present invention relates to a semiconductor device applying a so-called WL-CSP (Wafer Level-Chip Size Package) technology.

2. Description of Related Art

With the recent making of semiconductor devices more advanced in function and multifunctional, practical use of WL-CSP technology is progressing. With a WL-CSP technology, a packaging process is completed in a wafer state, and a size of each individual chip cut out by dicing becomes a package size.

FIG. 4 is a schematic sectional view of a structure of a semiconductor device to which a WL-CSP technology is applied.

The semiconductor device 101 includes a semiconductor chip (not shown) making up a base thereof. An interlayer insulating film 102 made of $SiO_2$ (silicon dioxide) is formed on the semiconductor chip. A wiring 103 made of Al (aluminum) is formed in a predetermined wiring pattern on the interlayer insulating film 102. A passivation film 104 made of SiN (silicon nitride) is formed on the interlayer insulating film 102 and the wiring 103. An opening 105 for exposing a portion of the wiring 103 from the passivation film 104 is formed in the passivation film 104.

A barrier film 106 made of Ti (titanium) is formed on a portion of the wiring 103 facing the opening 105. A peripheral edge portion of the barrier film 106 rides on the passivation film 104. A post bump 107 made of Cu (copper) is formed on the barrier film 106. A side surface of the post bump 107 is flush with a side surface of the barrier film 106. A solder ball 108 is formed on the post bump 107. The solder ball 108 is an external terminal connected to an external wiring on a wiring substrate. By the solder ball 108 being connected to the external wiring on the wiring substrate, electrical connection of the wiring 103 and the external wiring is achieved and the semiconductor device 101 is supported on the wiring substrate.

With such a structure, when an external force is applied to the solder ball 108, stress concentrates at the peripheral edge portion of the barrier film 106 and the post bump 107. By the concentration of stress, a crack may form in the passivation film 104 positioned immediately below the peripheral edge portion of the barrier film 106.

To prevent crack formation in the passivation film 104, forming of a polyimide layer having a penetrating hole in communication with the opening 105 on the passivation film 104 and positioning of the peripheral edge portion of the barrier film 106 on the polyimide layer may be considered. Because the polyimide layer is interposed between the peripheral edge portion of the barrier film 106 and the passivation film 104, even when stress concentrates at the peripheral edge portions of the barrier film 106 and the post bump 107, the stress is absorbed by the polyimide layer and is not transmitted to the passivation film 104. Crack formation in the passivation film 104 can thus be prevented.

However, because a step of forming the polyimide layer must be added, a number of manufacturing steps of the semiconductor device 101 is increased and this causes increase in manufacturing cost. Also, the polyimide layer must be formed to an adequate thickness capable of absorbing the stress. Thus, there is an issue of increase in thickness of the semiconductor device 101.

SUMMARY OF THE INVENTION

An object of the present invention is to provide a semiconductor device with which crack formation in a passivation film can be prevented without causing increase in number of manufacturing steps, increase in thickness and other problems.

A semiconductor device according to one aspect of the present invention includes: a semiconductor chip; a wiring formed on the semiconductor chip; a passivation film, coating the wiring and having an opening for partially exposing the wiring from the passivation film; an interposing film, formed on a portion of the wiring facing the opening; and a post bump, raisedly formed on the interposing film and with a peripheral edge portion thereof protruding more toward a side than a peripheral edge of the interposing film.

With this configuration, the wiring is formed on the semiconductor chip. The wiring is coated with the passivation film. The opening for partially exposing the wiring from the passivation film is formed in the passivation film. The interposing film is formed on the portion of the wiring facing the opening. The protuberant post bump, with its peripheral edge portion protruding more toward the side than the peripheral edge portion of the interposing film, is formed on the interposing film.

By the peripheral edge portion of the post bump protruding away from the opening for partially exposing the wiring more than the peripheral edge of the interposing film in a direction parallel to a surface of the passivation film, a space is formed between the peripheral edge portion of the post bump and the passivation film. By this space being present, the peripheral edge portion of the post bump is deformable in a direction of opposing the passivation film. Thus, even if a stress arises in the post bump, the stress can be absorbed by deformation of the peripheral edge portion of the post bump. Consequently, crack formation in the passivation film can be prevented.

Further, because a polyimide layer for stress relaxation is not interposed between the passivation film and the post bump, problems due to providing a polyimide layer, such as increase in number of manufacturing steps, increase in thickness of the semiconductor device, etc., do not occur.

Preferably, a protrusion amount of the peripheral edge portion of the post bump with respect to the peripheral edge of the interposing film is greater than a thickness of the interposing film. By the protrusion amount of the peripheral edge portion of the post bump thus being greater than the thickness of the interposing film, a width of the deformable peripheral edge portion of the post bump can be secured to be greater than the thickness of the interposing film.

To make the protrusion amount of the peripheral edge portion of the post bump greater than the film thickness of the interposing film, for example, a layer made of a material of the interposing film is formed on the passivation film and on the wiring, and after forming the post bump on this layer, in a step of patterning the layer made of the material of the interposing film by wet etching, an etching time is set so that etching progresses to below the post bump.

Further, a peripheral edge portion of the interposing film may be formed to ride on a circumference of the opening in the passivation film.

The foregoing and other objects, features, and effects of the present invention will become more apparent from the following detailed description of the embodiments with reference to the attached drawings.

DETAILED DESCRIPTION OF PREFERRED EMBODIMENTS

An embodiment of the present invention shall now be described in detail with reference to the attached drawings.

Figure 1:
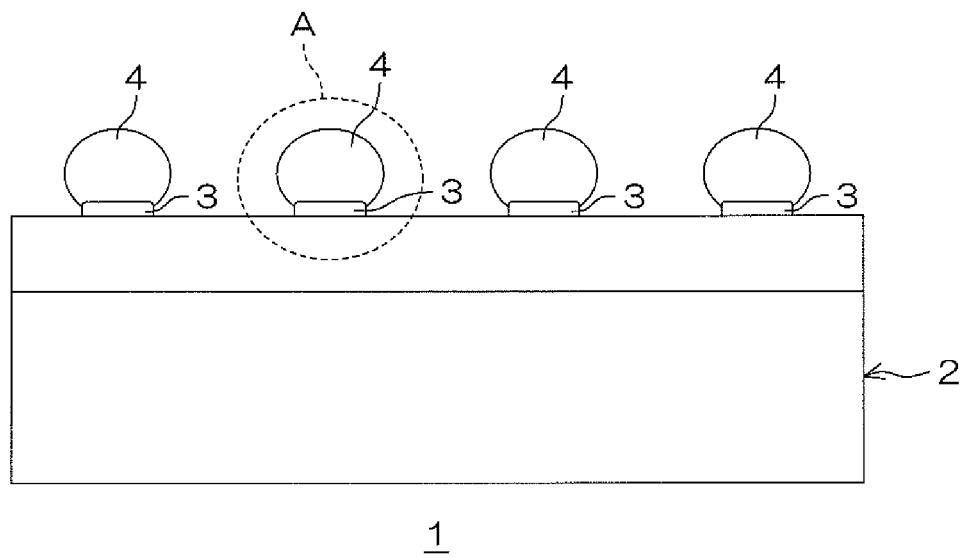
FIG. 1 is a side view of an outer appearance of a semiconductor device according to an embodiment of the present invention.

FIG. 1 is a side view of an outer appearance of a semiconductor device according to a first embodiment of the present invention.

A WL-CSP technology is applied in the semiconductor device 1. The semiconductor device 1 includes a semiconductor chip 2, a plurality of post bumps 3 disposed on the semiconductor chip 2, and solder balls 4 bonded to the respective post bumps 3.

Figure 2:
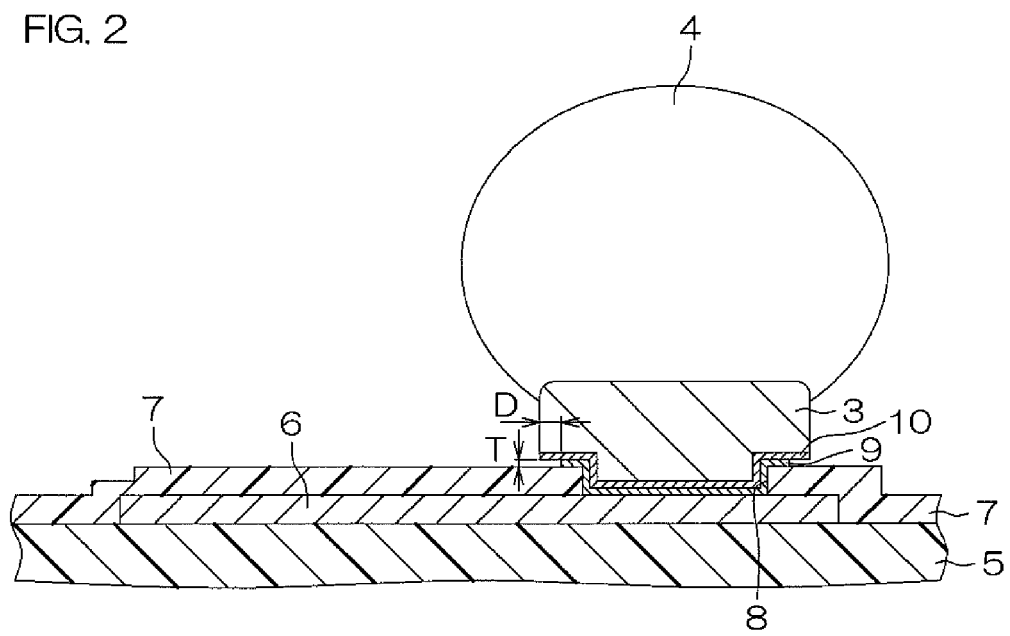
FIG. 2 is a schematic sectional view of a structure of a portion of the semiconductor device shown in FIG. 1.

FIG. 2 is a schematic sectional view of a structure of a portion surrounded by a broken line A in FIG. 1.

An interlayer insulating film 5 made of $SiO_2$ is formed on a top layer portion of the semiconductor chip 2. A wiring 6 made of Al is formed in a predetermined pattern on the interlayer insulating film 5.

A passivation film 7 made of SiN is formed on the interlayer insulating film 5 and the wiring 6. The wiring 6 is covered by the passivation film 7. An opening 8 for exposing a portion of the wiring 6 from the passivation film 7 is formed in the passivation film 7.

A barrier film 9 made of TiW (titanium tungsten) is coated on a portion of the wiring 6 facing the opening 8. The barrier film 9 has a predetermined thickness T (for example of 180 nm). The barrier film 9 covers a top surface of the wiring 6 and a side surface of the passivation film 7 inside the opening 8 and a peripheral edge portion thereof rides on a top surface of the passivation film 7.

A seed film 10 made of Cu is formed on the barrier film 9. A peripheral edge portion of the seed film 10 protrudes to a side with respect to a peripheral edge of the barrier film 9 by a protrusion amount D greater than the film thickness T of the barrier film 9.

The post bump 3 is protuberantly formed on the seed film 10. The post bump 3 is made, for example, of Cu. A side surface of the post bump 3 is substantially flush with a side surface of the seed film 10.

By a peripheral edge portion of the post bump 3 protruding more to the side than the peripheral edge of the barrier film 9, a space is formed between the peripheral edge portion of the post bump 3 and the passivation film 7. By the presence of this space, the peripheral edge portion of the post bump 3 is deformable in a direction of opposing the passivation film 7. Thus, even if a stress arises in the post bump 3, the stress can be absorbed by deformation of the peripheral edge portion of the post bump 3. Consequently, crack formation in the passivation film 7 can be prevented.

Also, because a polyimide layer for stress relaxation is not interposed between the passivation film 7 and the post bump 3, problems due to providing a polyimide layer, such as increase in number of manufacturing steps of the semiconductor device 1, increase in thickness of the semiconductor device 1, etc., do not occur.

The protrusion amount D of the peripheral edge portion of the post bump 3 is greater than the thickness T of the barrier film 9. A width of the deformable peripheral edge portion in the post bump 3 can thereby be secured to be greater than the thickness of the barrier film 9.

FIGS. 3A to 3E are schematic sectional views illustrating, in order of process, a method for manufacturing the semiconductor device shown in FIG. 2.

Figure 3A:
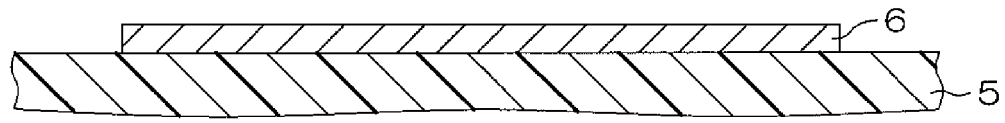
FIG. 3A is a schematic sectional view for describing a method for manufacturing the semiconductor device shown in FIG. 2.

First, as shown in FIG. 3A, the interlayer insulating film 5 is formed by a CVD (Chemical Vapor Deposition) method. Thereafter, by a sputter method, a metal film made of Al (not shown) is formed on the entire surface of the interlayer insulating film 5. Then, the metal film on the interlayer insulating film 5 is removed selectively by photolithography and etching. The wiring 6 having the predetermined pattern is thereby formed on the interlayer insulating film 5.

Figure 3B:
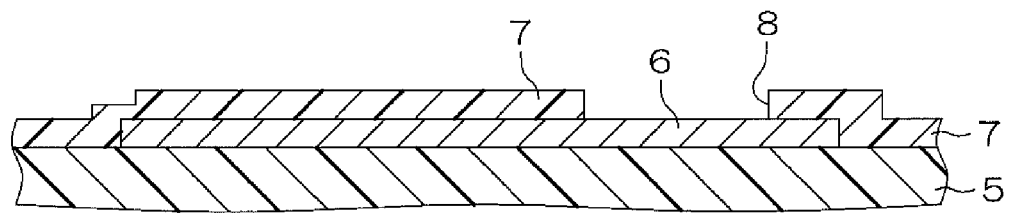
FIG. 3B is a schematic sectional view of a step subsequent to that of FIG. 3A.

Then, as shown in FIG. 3B, the passivation film 7 is formed on the interlayer insulating film 5 and the wiring 6 by the CVD method. Thereafter, a resist pattern (not shown) is formed on the passivation film 7. Then, the passivation film 7 is etched using the resist pattern as a mask. The opening 8 exposing a portion of the wiring 6 from the passivation film 7 is thereby formed in the passivation film 7. After the opening 8 is formed, the resist pattern is removed.

Figure 3C:
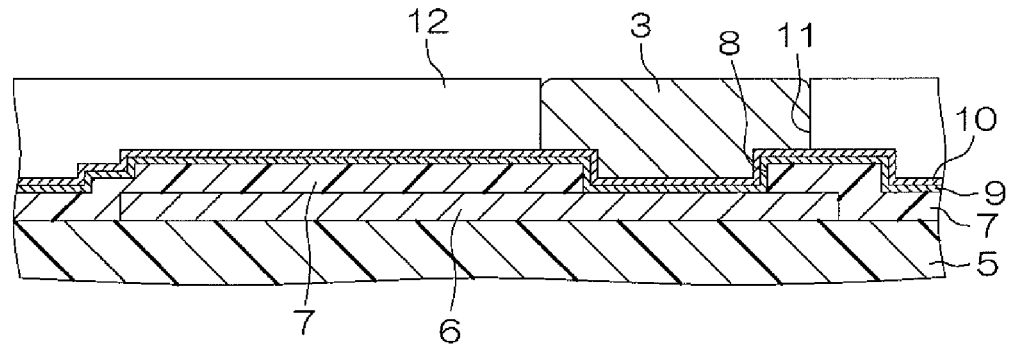
FIG. 3C is a schematic sectional view of a step subsequent to that of FIG. 3B.

Thereafter, as shown in FIG. 3C, the barrier film 9 made of TiW is formed on the portion of the wiring 6 facing the opening 8 and on the passivation film 7 by the sputter method. Then, the seed film 10 made of Cu is formed on the barrier film 9 by the sputter method. Then, a resist film 12 having an opening 11 at a portion at which the post bump 3 is to be formed is formed on the seed film 10. Thereafter, Cu is deposited inside the opening 11 of the resist film 12 by a plating method and the post bump 3 is thereby formed. After the post bump 3 is formed, the resist film 12 is removed.

Figure 3D:
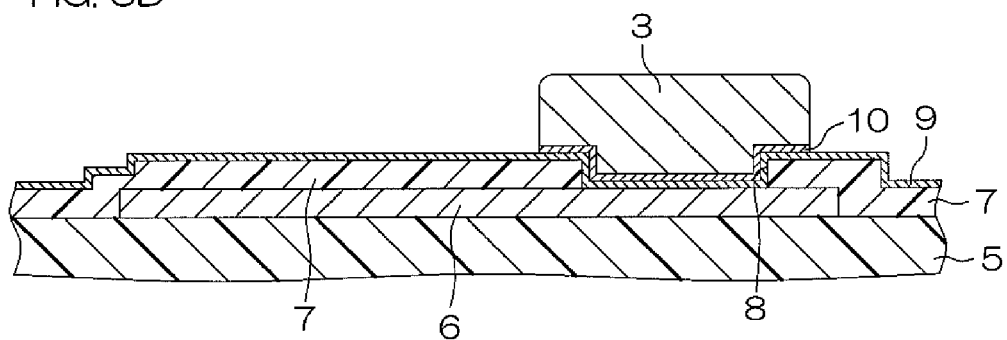
FIG. 3D is a schematic sectional view of a step subsequent to that of FIG. 3C.

Then, as shown in FIG. 3D, a portion of the seed film 10 exposed from the post bump 3 is removed by wet etching. That is, a liquid capable of etching the seed film 10 is supplied to the seed film 10 and the seed film 10 is removed with the exception of a portion in contact with the post bump 3. Thus, the seed film 10 having the side surface substantially flush with the side surface of the post bump 3 remains between the post bump 3 and the barrier film 9.

Figure 3E:
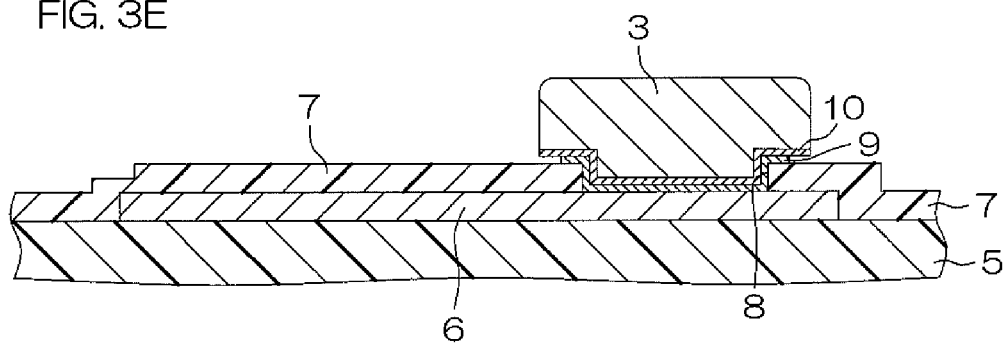
FIG. 3E is a schematic sectional view of a step subsequent to that of FIG. 3D.
Figure 4:
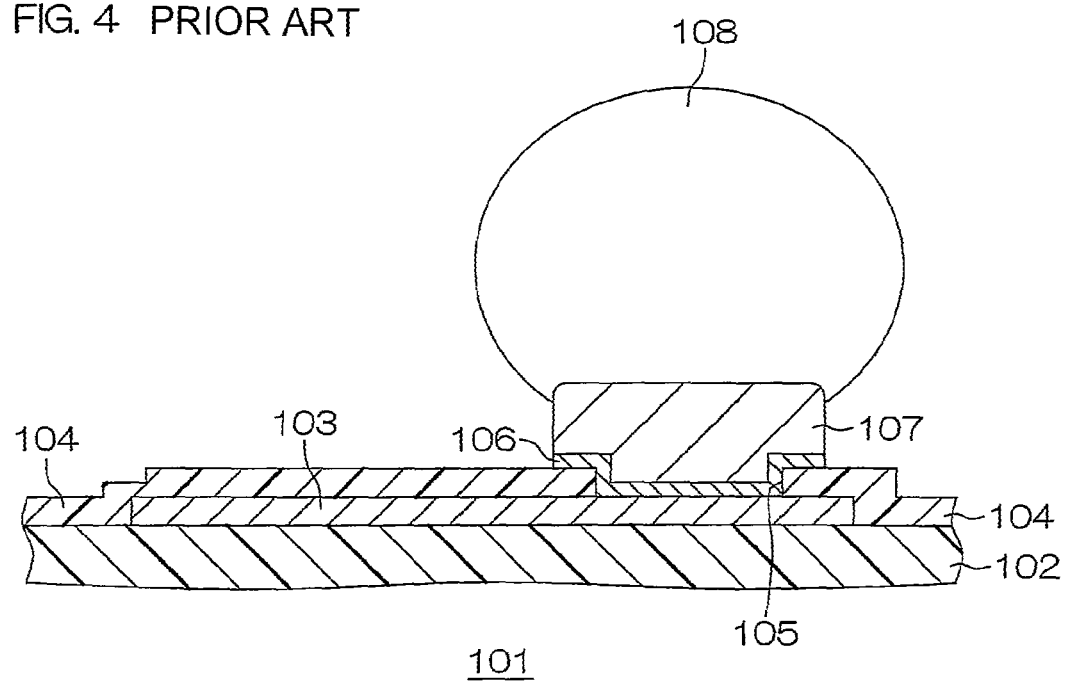
FIG. 4 is a schematic sectional view of a structure of a conventional semiconductor device.

Thereafter, a liquid capable of etching the barrier film 9 is supplied to the barrier film 9. In this process, an etching liquid supplying time is set so that the etching progresses to the barrier film 9 below the seed film 10. A portion of the barrier film 9 exposed from the seed film 10 and a portion of the barrier film 9 sandwiched between the peripheral edge portion of the seed film 10 and the passivation film 7 are thereby removed as shown in FIG. 3E. Consequently, the side surface of the barrier film 9 is positioned more to an inner side (the opening 8 side) than the side surface of the seed film 10, and the post bump 3 and the seed film 10 take on shapes with the peripheral edge portions protruding to the side with respect to the peripheral edge of the barrier film 9.

By thus setting the etching time in the process of patterning the layer made of the material of the barrier film 9 so that the etching progresses below the post bump 3, the protrusion amount D of the peripheral edge portion of the post bump 3 can be made greater than the thickness T of the barrier film 9. A space can thereby be formed between the peripheral edge portion of the seed film 10 and the passivation film 7 without causing increase in the number of manufacturing steps.

Various modifications may be applied to the present embodiment.

For example, the material of the barrier film 9 may be any material having a barrier property with respect to Cu. Ti (titanium), Ta (tantalum), and TaN (tantalum nitride) can be cited as examples of such a material.

Further, Au (gold) may be used as the material of the post bump 3. When Au is employed as the material of the post bump 3, TiW can be used as the material of the barrier film 9.

The wiring 6 may be formed using a metal material containing Cu. AlCu (aluminum/copper alloy) and Cu can be cited as examples of a metal material containing Cu. In this case, a wiring groove may be formed by digging in from an upper surface of the interlayer insulating film 5 and the wiring 6 may be embedded in this wiring groove.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

What is claimed is:
1. A semiconductor device comprising:
   a semiconductor chip;
   a wiring formed on the semiconductor chip;
   an insulating film, coating the wiring and having an opening for partially exposing the wiring from the insulating film;
   a first film made of Ti and W, formed on a portion of the wiring facing the opening;
   a Cu layer, formed by plating on the first film and on a portion of the wiring exposed through the insulating film such that an upper surface of the Cu layer is a uniform distance from an upper surface of the wiring, and having a peripheral edge portion thereof protruding away from the opening more than a peripheral edge of the first film in a direction parallel to a surface of the insulating film; and
   a solder ball bonded to the Cu layer,
   wherein a distance between the surface of the insulating film and the Cu layer is fixed,
   a protrusion amount of the peripheral edge portion of the Cu layer with respect to the peripheral edge of the first film is greater than a thickness of the first film,
   the Cu layer is stacked high enough that a surface of the first film does not vertically surpass the upper surface of the Cu layer in the center of the opening, and
   an interface between the Cu layer and the solder ball is arc-shaped on both sides of the upper surface of the Cu layer in a cross section taken perpendicularly to the upper surface of the Cu layer.

2. The semiconductor device according to claim 1, wherein a peripheral edge portion of the first film is formed to ride on a circumference of the opening in the insulating film.

3. The semiconductor device according to claim 1, wherein the Cu layer and the first film are both disposed over all surfaces of the opening.

4. The semiconductor device according to claim 1, wherein the first film is disposed over all surfaces of the opening.

5. The semiconductor device according to claim 1, wherein the surface of the insulating film is separated from the peripheral edge portion of the Cu layer by a gap.

6. The semiconductor device according to claim 1, wherein the thickness of the first film is around 180 nm.

7. The semiconductor device according to claim 1, wherein the solder ball partly covers the Cu layer such that a portion of a surface of the Cu layer is exposed form the solder ball.

8. The semiconductor device according to claim 7, wherein the portion of the surface of the Cu layer exposed from the solder ball includes a surface of the peripheral edge portion of the Cu layer that faces the surface of the insulating film via a gap therebetween.

9. A semiconductor device comprising:
   a semiconductor chip;
   a wiring on the semiconductor chip;
   a passivation film, coating the wiring and having an opening for partially exposing the wiring from the passivation film;
   a barrier film on a portion of the wiring facing the opening and having a peripheral edge;
   a post bump formed by plating on the barrier film such that the post bump has a uniform thickness, and having a peripheral edge portion protruding away from the opening, a protrusion amount of the peripheral edge portion of the post bump with respect to the peripheral edge of the barrier film being greater than a thickness of the barrier film; and
   a solder ball bonded to the post bump.

10. The semiconductor device according to claim 9, wherein a peripheral edge portion of the barrier film is formed to ride on a circumference of the opening in the passivation film.

11. The semiconductor device according to claim 9, wherein the post bump and the barrier film are both disposed over all surfaces of the opening.

12. The semiconductor device according to claim 9, wherein the barrier film is disposed over all surfaces of the opening.

13. The semiconductor device according to claim 9, wherein the surface of the passivation film is separated from the peripheral edge portion of the post bump by a gap.

14. The semiconductor device according to claim 9, wherein the thickness of the barrier film is around 180 nm.

15. The semiconductor device according to claim 9, wherein the solder ball partly covers the post bump such that a portion of a surface of the post bump is exposed form the solder ball.

16. The semiconductor device according to claim 15, wherein the portion of the surface of the post bump exposed from the solder ball includes a surface of the peripheral edge portion of the post bump that faces the surface of the passivation film via a gap therebetween.

17. The semiconductor device according to claim 9, wherein the barrier film is made TiW, and the post bump is made of Cu.

\* \* \* \* \*